(12) United States Patent
Bao et al.

(10) Patent No.: US 10,790,199 B2
(45) Date of Patent: Sep. 29, 2020

(54) DUAL CHANNEL SILICON/SILICON GERMANIUM COMPLEMENTARY METAL OXIDE SEMICONDUCTOR PERFORMANCE WITH INTERFACE ENGINEERING

(71) Applicant: INTERNATIONAL BUSINESS MACHINES CORPORATION, Armonk, NY (US)

(72) Inventors: Ruqiang Bao, Wappingers Falls, NY (US); Hemanth Jagannathan, Niskayuna, NY (US); Choonghyun Lee, Rensselaer, NY (US); Richard G. Southwick, Albany, NY (US)

(73) Assignee: ELPIS TECHNOLOGIES INC. (CA)

( * ) Notice: Subject to any disclaimer, the term of this patent is extended or adjusted under 35 U.S.C. 154(b) by 0 days.

(21) Appl. No.: 16/371,621

(22) Filed: Apr. 1, 2019

(65) Prior Publication Data

US 2019/0229020 A1 Jul. 25, 2019

Related U.S. Application Data

(62) Division of application No. 15/497,817, filed on Apr. 26, 2017, now Pat. No. 10,361,130.

(51) Int. Cl.
*H01L 21/8238* (2006.01)
*H01L 29/66* (2006.01)
(Continued)

(52) U.S. Cl.
CPC .. *H01L 21/823821* (2013.01); *H01L 21/0217* (2013.01); *H01L 21/02255* (2013.01);
(Continued)

(58) Field of Classification Search
CPC ........... H01L 21/823821; H01L 29/785; H01L 27/0924; H01L 21/0217; H01L 21/02255; H01L 21/31111; H01L 21/324; H01L 21/823814; H01L 21/823828; H01L 21/823807; H01L 29/1054;
(Continued)

(56) References Cited

U.S. PATENT DOCUMENTS 7,186,600 B2 3/2007 Ohtani et al.
7,282,398 B2 10/2007 Yamazaki et al.
(Continued)

OTHER PUBLICATIONS

List of IBM Patents or Patent Applications Treated as Related dated Apr. 1, 2019, 2 pages.
(Continued)

*Primary Examiner* — Mohammad M Hoque
(74) *Attorney, Agent, or Firm* — Tutunjian & Bitetto, P.C.

(57) ABSTRACT

A method of forming fin structures that includes providing at least one silicon germanium containing fin structure, and forming a fin liner on the at least one silicon germanium containing fin structure. The fin liner includes a silicon germanium and oxygen containing layer. The method continues with annealing the at least on silicon germanium containing fin structure having the fin liner present thereon. During the annealing, the silicon germanium oxygen containing layer reacts with the silicon germanium containing fin structure to provide surface formation of a silicon rich layer on the silicon germanium containing fin structure.

20 Claims, 5 Drawing Sheets

(51) Int. Cl.
| | |
|---|---|
| *H01L 29/10* | (2006.01) |
| *H01L 29/78* | (2006.01) |
| *H01L 27/092* | (2006.01) |
| *H01L 21/02* | (2006.01) |
| *H01L 21/311* | (2006.01) |
| *H01L 21/324* | (2006.01) |
| *H01L 29/161* | (2006.01) |

(52) U.S. Cl.
CPC ...... *H01L 21/31111* (2013.01); *H01L 21/324* (2013.01); *H01L 21/823807* (2013.01); *H01L 21/823814* (2013.01); *H01L 21/823828* (2013.01); *H01L 27/0924* (2013.01); *H01L 29/1054* (2013.01); *H01L 29/66795* (2013.01); *H01L 29/785* (2013.01); *H01L 21/0262* (2013.01); *H01L 21/02532* (2013.01); *H01L 21/823842* (2013.01); *H01L 29/161* (2013.01)

(58) Field of Classification Search
CPC ....... H01L 29/66795; H01L 21/823842; H01L 21/0262; H01L 29/161; H01L 21/02532
See application file for complete search history.

(56) References Cited

U.S. PATENT DOCUMENTS

| | | |
|---|---|---|
| 7,993,999 B2 | 8/2011 | Basker et al. |
| 8,785,909 B2 | 7/2014 | Radosavljevic et al. |
| 8,952,460 B2 | 2/2015 | Brodsky et al. |
| 9,105,745 B2 | 8/2015 | Ando et al. |
| 9,595,449 B1 | 3/2017 | Jagannathan et al. |
| 2014/0273412 A1 | 9/2014 | Wu et al. |
| 2016/0218216 A1* | 7/2016 | Diaz .................. H01L 29/7848 |

OTHER PUBLICATIONS

Wang, S.K. et al., "Desorption kinetics of GeO from GeO2 /Ge structure" Journal of Applies Physics (Sep. 2010) pp. 054104-1-054104-8, vol. 108.

Valvo, M. et al., "Localized Si enrichment in coherent self-assembled Ge islands grown by molecular beam epitaxy on (001)Si single crystal" Journal of Applies Physics (Jan. 2013) pp. 033513-1-033513-17, vol. 113.

* cited by examiner

DUAL CHANNEL SILICON/SILICON GERMANIUM COMPLEMENTARY METAL OXIDE SEMICONDUCTOR PERFORMANCE WITH INTERFACE ENGINEERING

BACKGROUND

Technical Field

The present invention generally relates to semiconductor devices, and more particularly to semiconductor devices including fin structures.

Related Art

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. In view of the possibility of scaling reaching its limits, other semiconductor geometries, such as fin field effect transistors (finFETs), and strained semiconductor materials, such as compressive strain silicon germanium (SiGe), have been considered. One of the promising dual channel complementary metal oxide integration schemes is to use tensile strained silicon for the n-type field effect transistors, e.g., n-type FinFETs, and to use compressive strained silicon germanium for p-type field effect transistors, e.g., p-type FinFETs. It has been determined that unwanted germanium pile-up at the silicon germanium fin periphery is generally present at the FIN reveal process, which can be the root cause of high interface states resulting in the degradation of SiGe FinFET device performance. To take further advantage of FinFET geometries and silicon germanium compressive strained materials, methods and structure are needed to reduce germanium pile up.

SUMMARY

In accordance with one embodiment, a method of forming fin structures is provided that includes providing at least one silicon germanium containing fin structure, and forming a fin liner on said at least one silicon germanium containing fin structure. The fin liner includes a silicon germanium and oxygen containing layer. The method continues with annealing the at least on silicon germanium containing fin structure having the fin liner present thereon. During the annealing, the silicon germanium oxygen containing layer reacts with said silicon germanium containing fin structure to provide surface formation of a silicon rich layer on the silicon germanium containing fin structure. The production of the silicon rich layer reduces the formation of germanium pile up on the periphery of the silicon germanium fin structure.

In another aspect, a method of forming semiconductor devices in described herein. In one embodiment, the method of forming semiconductor devices includes providing at least one silicon germanium containing fin structure and at least one silicon containing fin structure, and forming a fin liner on each of said at least one silicon germanium containing fin structure and said at least one silicon containing fin structure. In some embodiments, the fin liner includes a silicon germanium and oxygen containing layer. The method can continue with annealing the at least one silicon germanium containing fin structure having the fin liner present thereon, wherein during the annealing the silicon germanium oxygen containing layer reacts with said silicon germanium containing fin structure to provide surface formation of a silicon rich layer on the silicon germanium containing fin structure. A portion of the fin liner on the at least one silicon germanium containing fin structure and at least one silicon containing fin structure is recessed. In some embodiments, a first conductivity field effect transistor is formed using the at least one silicon germanium containing fin structure, and a second conductivity field effect transistor is formed using the at least one silicon germanium containing fin structure. The production of the silicon rich layer reduces the formation of germanium pile up on the periphery of the silicon germanium fin structure.

In another aspect, a semiconductor device is described herein, that includes a silicon germanium containing fin structure with a silicon rich surface layer. In some embodiments, the semiconductor device includes at least one silicon germanium containing fin structure on a supporting substrate having a surface layer that is opposite a base of the fin structure in contact with the supporting substrate, the surface layer being a silicon rich layer that is present on a channel portion and source and drain region portions of said at least one silicon germanium containing fin structure. A fin liner is present along sidewalls of the at least one silicon germanium containing fin structure that are positioned between the silicon rich layer and the supporting substrate. A gate structure is present on the channel portion of the at least one silicon germanium containing fin structure. Source and drain regions of epitaxial semiconductor material are present on the source and drain region portions of said at least one silicon germanium containing fin structure. The production of the silicon rich layer reduces the formation of germanium pile up on the periphery of the silicon germanium fin structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", and derivatives thereof shall relate to the disclosed structures, as they are oriented in the drawing figures.

The methods and structures disclosed herein provide fin structures, such as fin field effect transistors (finFETs). As used herein, the term "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. In some embodiments, the methods and structures disclosed herein provide a first conductivity finFET having a fin structure composed of a silicon germanium containing material and a second conductivity finFET having a fin structure composed of a silicon material on the same substrate. By "same substrate" it is meant that the first conductivity finFET, e.g., p-type finFET, and the second conductivity finFET, e.g., n-type finFET, are present simultaneously on the same substrate in different regions of the same substrate. Typically, the first conductivity finFET and the second conductivity finFET are present on a same surface, e.g., upper surface, of the semiconductor substrate.

Figure 1:
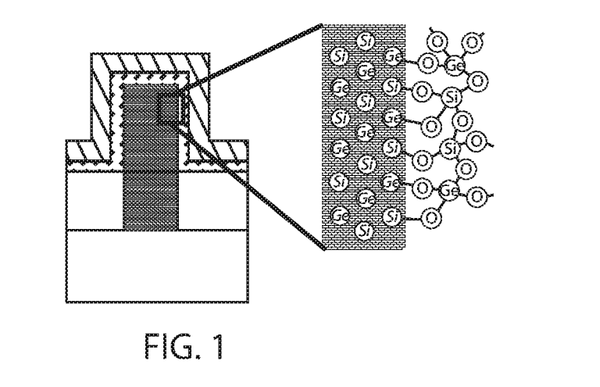
FIG. 1 is a side cross-sectional view illustrating one example of germanium pile up at the silicon germanium (SiGe)/silicon germanium oxide (SiGeO$_x$) interface on a silicon germanium channel of a fin structure.

One of the promising dual channel complementary metal oxide integration schemes is to use tensile strained silicon for the n-type field effect transistors, e.g., n-type FinFETs, and to use compressive strained silicon germanium for p-type field effect transistors, e.g., p-type FinFETs. It has been determined that unwanted germanium pile-up at the silicon germanium fin periphery is generally present at the FIN reveal process, which can be the root cause of high interface states resulting in the degradation of SiGe FinFET device performance. One example of germanium pile up is depicted in FIG. 1, which illustrates the silicon germanium (SiGe)/silicon germanium oxide ($SiGeO_x$) interface on a silicon germanium channel of a fin structure. Uniaxial epitaxial growth of thin silicon (Si) cap layers on silicon germanium (SiGe) fin structures can be impossible because of the orientation dependence of epitaxial growth for silicon (silicon) and the surface roughness of the fin structure that results from germanium pile up. A common interfacial layer on the dual channel silicon/silicon germanium complementary metal oxide semiconductor device can be required to avoid gate stack variation.

In some embodiments, the methods, structures and process schemes described herein provide a silicon rich surface layer on fin structures composed of silicon germanium, which can improve device performance of silicon/silicon germanium dual channel complementary metal oxide semiconductor (CMOS) devices. As will be described in greater detail below, in some embodiments, the silicon rich surface layer is provided using an fin liner that can include a first layer in contact with the silicon germanium containing fin that is composed of silicon germanium oxide ($SiGeO_x$) and a second layer atop the silicon germanium oxide ($SiGeO_x$) that is composed of a nitride containing composition, in which the fin liner in combination with a spike anneal effectively converts the silicon germanium surface of the fin structure to a silicon rich surface layer. It is noted that the fin liner and anneal process may be equally applied to a silicon fin structure that is present on the same substrate as the silicon germanium fin structure to provide the silicon rich surface layer on the silicon germanium fin without changing the profile of the silicon fin structure. In some embodiments, the use of the aforementioned fin liner, and spike anneal only modifies the silicon germanium surface of the silicon germanium fin, because of the reaction of the silicon germanium oxide ($SiGeO_x$) with the silicon germanium (SiGe) surface during the spike anneal. After, the high temperature spike anneal, and the silicon rich layer is formed on the exterior of the silicon germanium fin structure, the resulting structure provides for p-type semiconductor devices, e.g., p-type FinFETs, having a low interface trap charge and high hole mobility. For the n-type semiconductor device, e.g., n-type FinFETs, that are present on the same substrate of the p-type semiconductor devices including the silicon rich layer on a silicon germanium fin structure, there is no reaction of the silicon oxide dummy oxide with the silicon surface. The methods and structures of the present disclosure are now discussed in greater detail with reference to FIGS. 2-9.

Figure 2:
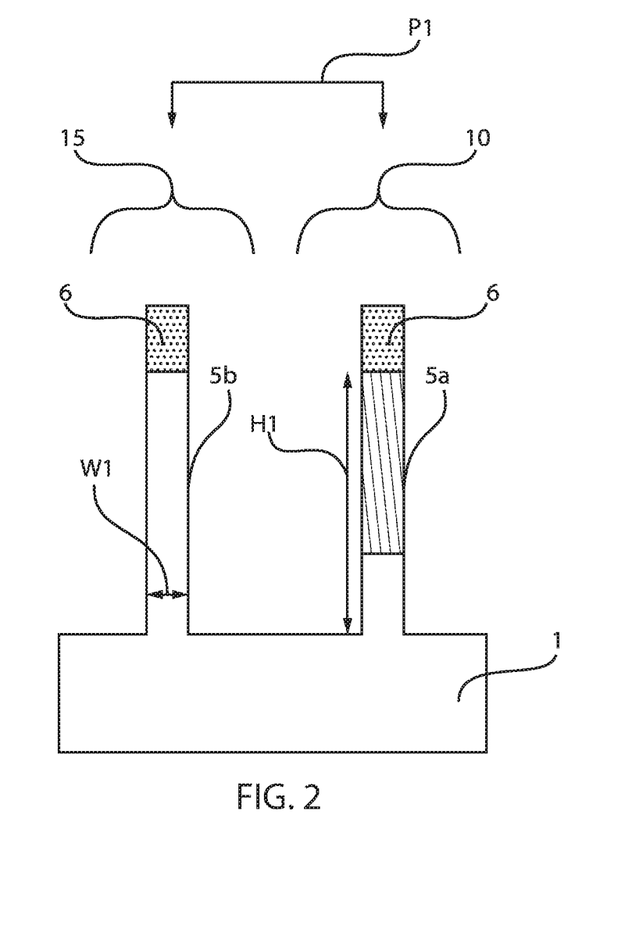
FIG. 2 is a side cross-sectional view illustrating one embodiment of forming a first fin structure composed of a silicon germanium containing material in a first region of a supporting substrate, and forming a second fin structure composed of silicon containing material in a second region of the supporting substrate.

FIG. 2 depicts one embodiment of forming fin structures 5a, 5b on the same supporting substrate 1, in which a silicon germanium containing fin structure 5a is present in a first region of the substrate 1 and a silicon containing fin structure 5b is present in a second region of the substrate 1. In the embodiment depicted in FIG. 2, the supporting substrate may be a bulk silicon substrate. The term "bulk" as used in to describe the "substrate" denotes that the entire substrate is comprised of a semiconductor material. For example, the entirety of the substrate 1 may be silicon (Si). In some embodiments of the present application, the bulk silicon substrate 1 may be single crystalline silicon. The crystal orientation of the bulk silicon substrate 1 may be {100}, {110}, or {111}. Other crystallographic orientations besides those specifically mentioned can also be used in the present application. Further, although the substrate 1 is depicted as being a bulk semiconductor, the substrate may also be a semiconductor on insulator (SOI) substrate, e.g., including a silicon upper semiconductor layer present on a buried oxide layer, in which the buried oxide layer is present on a base substrate.

Referring to FIG. 2, at least one first fin structure 5a, i.e., a fin structure composed of a silicon and germanium containing semiconductor, e.g., silicon germanium (SiGe) is formed in a first region 10 of the substrate 1, and at least one second fin structure 5b composed of silicon containing semiconductor, e.g., silicon (Si), is formed in a second region 15 of the substrate 1. The first and second fin structures 5a, 5b may be formed using epitaxial growth processes in combination with photolithography and etching.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

For example, the material layer for the at least one first fin structure 5a, i.e., the silicon and germanium containing fin structure, may be epitaxially formed atop the supporting substrate 1. In some embodiments, in which the at least one first fin structure 5a is further processed to provide a p-type semiconductor device, e.g., p-type FinFET, the composition of the material layer for the at least one first fin structure 5a is selected to have a compressive strain. To provide a compressive strain, the lattice dimension for the material layer for the at least one first fin structure 5a is selected to be greater than the lattice structure of the deposition surface that the material layer is being epitaxially grown on. For example, when the supporting substrate 1 is composed of silicon (Si), germanium may be employed to provide a greater lattice dimension for the material layer for the at least one first fin structure 5a, which provides a fin structure having a compressive strain suitable for increasing the carrier speed for p-type charge carriers in p-type semiconductor devices.

In some embodiments, the material layer for the at least one first fin structure 5a may be composed of silicon germanium (SiGe). In some embodiments, the material layer for the at least one first fin structure 5a may be composed of silicon germanium (SiGe) or germanium (Ge). For example, the material layer for the at least one first fin structure 5a may be composed of up to 99 at. % germanium. In one embodiment, the material layer for the at least one first fin structure 5a comprises from 1 wt. % germanium to 99 wt. % germanium. In another embodiment, the material layer for the at least one fin structure 5a is composed of 10 wt. % to 50 wt. % germanium.

In some embodiments, the material layer for the at least one first fin structure 5a may be blanket formed atop an entirety of the upper surface of the supporting substrate 1 using an epitaxial growth process. In some embodiments, in which the material layer for the at least one fin structure 5a is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof. The material layer for the at least one fin structure 5a may be deposited using the deposition chamber of a chemical vapor deposition (CVD) apparatus, such as a plasma enhanced chemical vapor deposition (PECVD) apparatus or a metal organic chemical vapor deposition (MOCVD) apparatus.

The material layer for the at least one first fin structure 5a may be patterned and etched to remove the material from a second region 15 of the supporting substrate 1, wherein the remainder of the material layer for the at least one fin structure 5a is present in the first region 10 of the supporting substrate. The patterning process may be provided using photolithography and soft and/or hard masks. In some embodiments, the etch process may be an anisotropic etch process, such as reactive ion etch. In the embodiments in which the supporting substrate 1 is composed of silicon (Si), removing the material layer for the at least one fin structure 5a from the second region 15 of the supporting substrate 1 provides an exposed silicon surface that can provide the epitaxial growth surface for forming the material layer for the at least one second fin structure 5b. As noted above, the at least one second fin structure 5b may be composed of silicon containing material, e.g., a silicon containing material that is free of germanium, i.e., silicon (Si).

The material layer for the at least one second fin structure 5b may be epitaxially formed in the second region 15 of the supporting substrate 1. In some embodiments, a block mask, such as the photoresist mask or hardmask (e.g., silicon nitride mask), may be used to protect the material layer for the at least one first fin structure 5a during the deposition of the material layer for the at least one second fin structure 5b. The mask used at this stage of the process flow can be the mask used to pattern and etch the material layer for the first fin structure 5a, as well as expose the upper surface of the supporting substrate 1 in the first region of the supporting substrate 1. In some embodiments, epitaxial growth is a selective deposition process, in which the deposited semiconductor material will be formed on exposed semiconductor surface, e.g., the supporting substrate 1 in the second region 15, but will not form on dielectric materials, for example the masking structures protecting the material for the first fin structures 5a in the first region 10 of the substrate 1.

The material layer for the at least one second fin structure 5b is formed using an epitaxial deposition process that is similar to the deposition process for forming the material layer for the at least one first fin structure 5a with the exception that the epitaxial deposition process for the at least one second fin structure 5b does not include a germanium containing gas source, i.e., does not deposit germanium containing elements. In some embodiments, the material layer for the at least one second fin structure 5b may greater than 95 at. % silicon, and can be substantially pure silicon, e.g., 99 at. % silicon or greater. In some examples, the at least one second fin structure 5b may have a base material composition that is 100 at. % silicon.

In some embodiments, the at least one second fin structure 5b may be processed to provide an n-type semiconductor device, e.g., n-type FinFET. In some examples, to increase the carrier speed of the n-type device, the at least one second fin structure 5b may have a tensile strain, which can result from a difference in lattice dimension that results from a lesser lattice dimension material being epitaxially grown on a deposition surface having a greater lattice dimension. For example, a buffer layer of silicon germanium may be present between the silicon (Si) material layer for the at least one second fin structure 5b, and the silicon (Si) surface of the supporting substrate 1. In another example, a dopant may be introduced, such as carbon, to the material layer for the at least one second fin structure 5b to provide a smaller lattice dimension. In one example, a material layer for the second fin structure 5b of silicon doped with carbon (Si:C) formed on a silicon supporting substrate 1 can provide a tensile strain for increasing carrier speed of n-type devices.

The material layers for the first and second fin structures 5a, 5b have an upper surface that can be coplanar. In some embodiments, etch processes and planarization processes, such as chemical mechanical planarization (CMP), can be used to increase the planarity of the upper surfaces for the first and second fin structures 5a, 5b.

In a following process sequence, the material layers for the at least one first fin structure 5a and the at least one second fin structure 5b may be patterned and etched to provide the geometry of fin structures. The fin structure geometries may be formed using photolithography and etch processes. In one embodiment, a hard mask 6 is formed on the material layers for the first and second fin structures 5a, 5b.

For example, a dielectric layer for the hard mask 6, such as a nitride or oxide material layer, may be blanket deposited atop the material layer for the first and second fin structures 5a, 5b prior to etching to form the fin structure geometries. For example, the dielectric layer for the hard mask 6 may be blanket deposited using a deposition process, such as chemical vapor deposition (CVD), e.g., plasma enhanced chemical vapor deposition (PECVD), chemical solution deposition, spin on deposition or physical vapor deposition. The dielectric layer for the hard mask 6 may have a thickness ranging from 2 nm to 15 nm. In some examples, the blanket deposited hard mask dielectric layer may be composed of silicon nitride, e.g., $Si_3N_4$, silicon oxynitride or silicon oxide.

An etch mask, e.g., photoresist mask, may then be formed on the blanket deposited dielectric layer for the hard mask 6. To provide the photoresist mask, a photoresist layer is first positioned on the layer of the dielectric material that provides dielectric fin cap, i.e., hard mask 6. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

The blanket deposited hard mask layer than may be etched using an etch process that is selective to at least the photoresist mask, wherein the portion of the blanket deposited hard mask layer protected by the photoresist mask remain to provide the hard mask 6 and the exposed portions of the blanket deposited hard mask layer are removed. The photoresist mask may then be removed.

The material layers for the first and second fin structures 5a, 5b may then be etched using the hard mask as an etch mask to form the fin structures. The etch process for forming the at least one first fin structure 5a and the at least one second fin structure 5b may be an anisotropic etch. Examples of anisotropic etching that can be used at this point of the present disclosure include ion beam etching, plasma etching or laser ablation. In some embodiments, the etch process for defining the fin structures can be a timed etch. It is noted that the above description of the etch sequence for forming the at least one first fin structure 5a and the at least one second fin structure 5b is only one example, and the present disclosure is not intended to be limited to only this example. For example, the etch process for forming the fin structures may be included within a sidewall image transfer (SIT) process flow in which a mandrel structure is used to form a spacer, in which following formation of the spacer, the mandrel is removed and the spacer can function as an etch mask.

Still referring to FIG. 2, the etch process may continue until each of the fin structures 5a, 5b can have a height H1 ranging from 5 nm to 200 nm. In another embodiment, each of the fin structures 5a, 5b has a height H1 ranging from 10 nm to 100 nm. In one example, each of the fin structures 5a, 5b has a height H1 ranging from 20 nm to 50 nm. Each of the fin structures 5a, 5b may have a width W1 of less than 15 nm. In another embodiment, each of the fin structures 5a, 5b has a width W1 ranging from 3 nm to 8 nm. It is noted that any number of fin structures 5a, 5b may be employed in each of the first and second regions 10, 15 of the supporting substrate 1. In some embodiments, the pitch P1, i.e., center to center, distance separating adjacent fin structures 5a, 5b may range 35 nm to 45 nm. In another example, the pitch P1 separating adjacent fin structures 5a, 5b may range from 30 nm to 40 nm.

For the purposes of simplicity the at least one first fin structure 5a is hereafter referred to as a silicon and germanium containing fin structure 5a, and the at least one second fin structure 5b is hereafter referred to as a silicon containing fin structure 5b.

Figure 3:
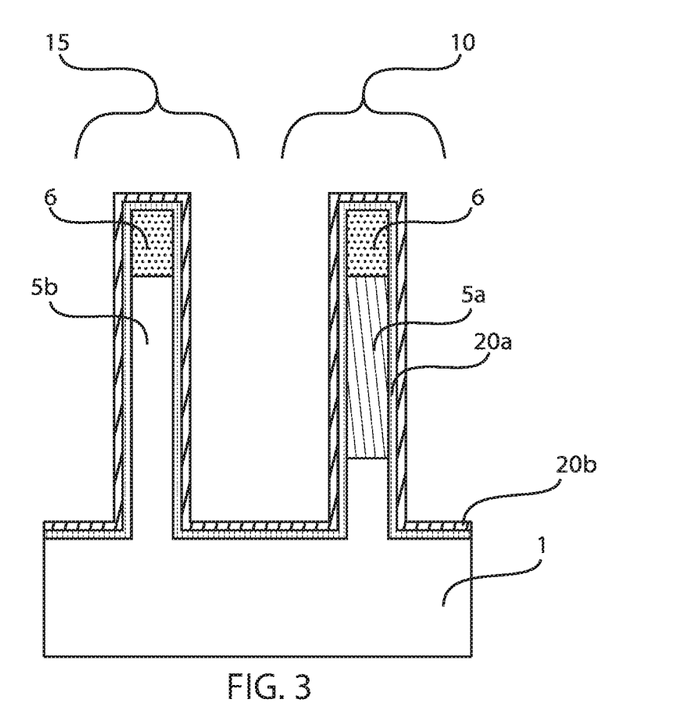
FIG. 3 is a side cross-sectional view depicting one embodiment of forming a fin liner on each of the at least one silicon germanium containing fin structure and at least one silicon containing fin structure, wherein the fin liner includes a silicon germanium and oxygen containing layer.

FIG. 3 depicts one embodiment of forming a fin liner 20a, 20b on each of the at least one silicon germanium containing fin structure 5a and at least one silicon containing fin structure 5b. In some embodiments, the fin liner includes a silicon germanium and oxygen containing layer 20a that is in direct contact with at least the silicon germanium containing fin structure 5a, and can also be in contact with the silicon containing fin structure 5b. The fin liner also includes a nitride containing layer 20b that is present on the silicon germanium and oxygen containing layer 20a.

In some embodiments, the silicon germanium and oxygen containing layer 20a is composed of silicon germanium and oxygen containing material. In some embodiments, the silicon, germanium and oxygen containing material 20a is silicon germanium oxide ($SiGeO_2$), but due to oxygen variations that result from deposition variations the material can be referred to as $SiGeO_x$. The silicon content of the silicon germanium oxide ($SiGeO_x$) layer may range from 5 at. % to 45 at. %. The germanium content of the silicon germanium oxide ($SiGeO_x$) layer may range from 10 at. % to 40 at. %. The oxygen content of the silicon germanium oxide ($SiGeO_x$) layer may range from 20 at. % to 30 at. %. (It is noted that the above composition is provided for illustrative purposes only, and is not intended to limit the present disclosure to only this example. Other silicon and germanium containing compositions are equally suitable for use with the present disclosure so long as facilitating the formation of a silicon rich surface on the silicon and germanium containing fin structures 5a during the anneal process that is described below.

The silicon germanium and oxygen containing layer 20a may be blanket deposited atop the entirety of the structure depicted in FIG. 2. The silicon germanium and oxygen containing layer 20a is in direct contact with at least the sidewalls of the silicon and germanium containing fin structure 5a. For example, the silicon germanium and oxygen containing layer 20 may be a continuous layer that is present on the sidewalls and overlying the upper surfaces of the silicon and germanium containing fin structure 5a, and may extend continuously across the upper surface of the supporting substrate onto the sidewalls and overlying the upper surfaces of the silicon containing fin structure 5b. In some embodiments, the silicon and germanium containing layer 20a has a thickness that is nanoscale, i.e., less than 1 micron. For example, the silicon and germanium containing layer 20a may have a thickness ranging from 1 nm to 10 nm. In some other examples, the silicon and germanium containing layer 20a may have a thickness ranging from 1 nm to 5 nm. The thickness of the silicon germanium and oxygen containing layer 20a is conformal. The term "conformal" denotes a layer having a thickness that does not deviate from greater than or less than 30% of an average value for the thickness of the layer.

The silicon germanium and oxygen containing layer 20a may be deposited using atomic layer deposition (ALD). Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a substrate by exposing its surface to alternate gaseous species (typically referred to as precursors). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

In some embodiments, the nitrogen containing layer 20b of the fin liner 20a, 20b is composed of silicon nitride. The nitrogen containing layer 20b may be deposited directly atop the silicon germanium and oxygen containing layer 20a and may be present over both the silicon and germanium containing fin structure 5a, the silicon containing fin structure 5b and the upper surface of the portion of the supporting substrate 1 that is separating the adjacent fin structures. The nitrogen containing layer 20b may be a continuous layer having a conformal thickness. For example, the nitrogen containing layer 20b may have a thickness ranging from 1 nm to 10 nm. In some other examples, the combined thickness of the silicon germanium and oxygen containing layer and the nitrogen containing layer 20b for the fin liner may range from 1 nm to 5 nm. The nitrogen containing layer 20b may be formed using atomic layer deposition (ALD).

Figure 4:
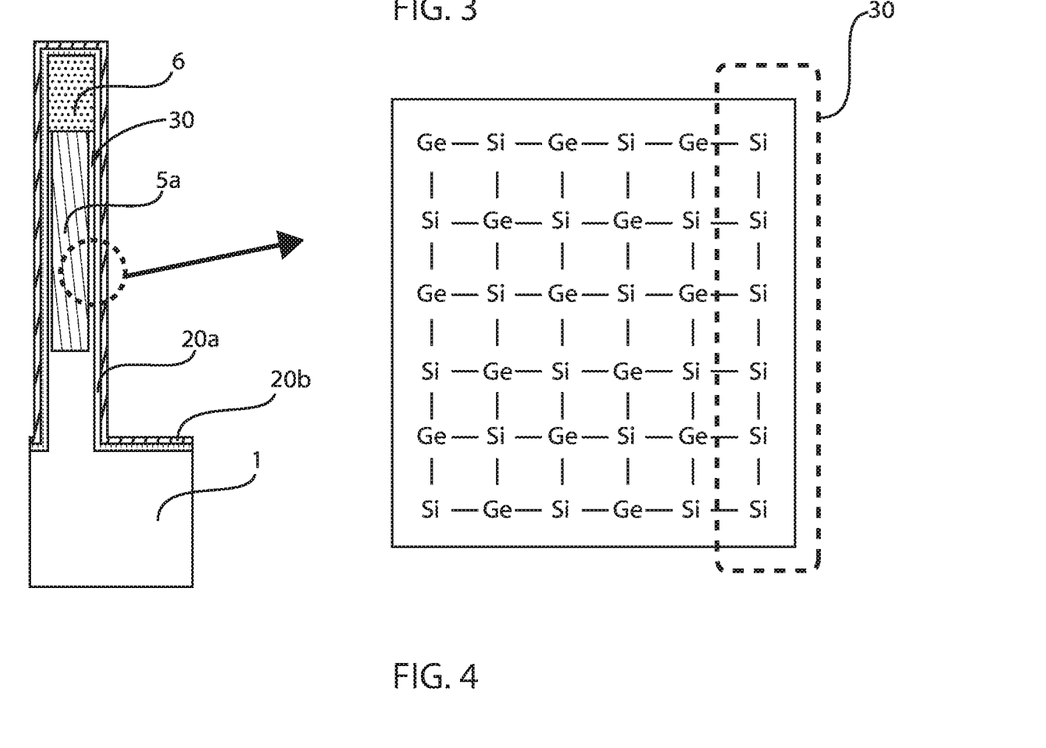
FIG. 4 is a side cross-sectional view depicting one embodiment of annealing the structure depicted in FIG. 3, in which the anneal process in combination with the fin liner including the silicon, germanium and oxygen containing layer that is present on the silicon germanium containing composition of the first fin structure produces a silicon rich surface layer on the silicon germanium fin structure.

FIG. 4 depicts one embodiment of annealing the structure depicted in FIG. 3, in which the anneal process in combination with the fin liner 20a, 20b including the silicon, germanium and oxygen containing layer 20a that is present on the silicon and germanium containing fin structure 5a produces a silicon rich surface layer 20 on at least the sidewall surface of the silicon and germanium containing fin structure 5a. The silicon rich surface layer 20 that is formed on the silicon and germanium containing fin structure 5a may be due to the reaction of the SiGe material of the fin structure with the silicon germanium and oxygen containing layer 20a of the fin liner 20a, 20b. In some embodiments, the reaction of the silicon germanium and oxygen containing layer 20a, i.e., $SiGeO_x$, can be as follows:

$$Ge + GeO_2 \rightarrow 2GeO \qquad (1)$$

The germanium monoxide (GeO) is a gas species that desorbs from the surface of the silicon and germanium containing fin structure 5a. In some embodiments, when the germanium desorbs (Ge) in the form of germanium oxide (GeO) gas from the surface of the silicon and germanium containing fin structure 5a, e.g., silicon germanium (SiGe), the germanium stacking is substantially eliminated, and the silicon that was present at the surface of the silicon and germanium containing fin structure remains to provide a silicon rich surface layer 30 at the sidewall surface of the silicon and germanium containing fin structure 5a that is in direct contact with the silicon germanium and oxygen containing layer 20a of the fin liner 20a, 20b.

The silicon rich surface layer 30 is a continuous layer having a monolayer scale thickness. By "monoscale thickness" it is meant that the thickness of the silicon rich surface layer 30 has a thickness ranging from 1 monolayer to 7 monolayers of silicon (Si) atoms. In some examples, the thickness of the silicon rich surface layer 30 may have a thickness ranging from 1 monolayer to 5 monolayers of silicon (Si) atoms. In some other examples, the thickness of the silicon rich surface layer 30 may be equal to 1 monolayer, 2 monolayers, 3 monolayers, 4 monolayers, 5 monolayers, 6 monolayers, and 7 monolayers, and any range of monolayers of silicon (Si) having a maximum value for the range provided by one of the aforementioned examples, and a minimum value for the range provided by one of the aforementioned examples.

The silicon rich surface layer 30 is substantially all silicon (Si). By being substantially all silicon (Si) it is meant that the minimum silicon contents is 97 at. % for the silicon rich surface layer 30 of the silicon and germanium containing fin structure 5a. In some examples, the silicon contents of the silicon rich surface layer 30 may range from 98 at. % to 100 at. %. For example, embodiments have been contemplated in which the silicon rich surface layer 30 has a silicon content that is equal to 99 at. % or 100 at. %.

The spike anneal may be provided by a rapid thermal annealing process. In other embodiments, the spike anneal may be provided by laser spike annealing (LSA) apparatus. In some embodiments, the temperature of the spike anneal for the reaction of the silicon germanium and oxygen layer 20a of the fin liner 20a, 20b with the silicon germanium containing fin structure 5a may range from 800 C to 1200 C. In some embodiments, the temperature of the spike anneal for the reaction of the silicon germanium and oxygen layer 20a of the fin liner 20a, 20b with the silicon germanium containing fin structure 5a may range from 900 C to 1100 C.

In one example, the temperature of the spike anneal for the reaction of the silicon germanium and oxygen layer 20a of the fin liner 20a, 20b with the silicon germanium containing fin structure 5a may be equal to 1077 C. The residence time of the spike anneal can be 2 seconds or less.

During the anneal process that forms the silicon rich surface 30 on the silicon and germanium fin structure 5a, the geometry of the silicon containing fin structure 5b is not changed. In some embodiments, there is no reaction between the silicon of the silicon containing fin structure 5b and the silicon germanium and oxygen containing layer 20a of the fin liner 20a, 20b.

Although a silicon and germanium containing fin structure 5a and a silicon containing fin structure 5b are provided on the same substrate 1, embodiments have been contemplated in which only silicon and germanium containing fin structures 5a are being formed.

Figure 5:
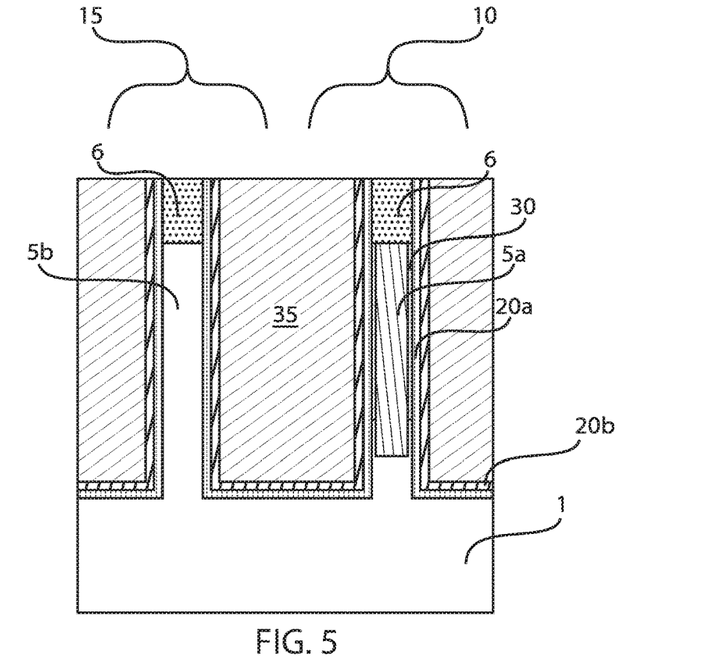
FIG. 5 is a side cross-sectional view depicting one embodiment of forming a dielectric fill material between adjacent fin structures of the at least one silicon germanium containing fin structure and the at least one silicon containing fin structure.

FIG. 5 depicts one embodiment of forming a dielectric fill material 35 between adjacent fin structures 5a, 5b of the at least one silicon germanium containing fin structure 5a, and the at least one silicon containing fin structure 5b. The dielectric fill material 35 may be composed of an oxide, such as silicon oxide ($SiO_2$). The dielectric fill material 35 may be deposited using chemical vapor deposition (CVD). Chemical vapor deposition (CVD) is a deposition process in which a deposited species is formed as a result of chemical reaction between gaseous reactants at greater than room temperature (25° C. to 90° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

In some embodiment, the dielectric fill material 35 may be deposited to have a height with an upper surface that is coplanar with the upper surface of the hard mask 6. In some embodiments, a planarization process, such as chemical mechanical planarization (CMP), may be employed to provide that the upper surface of the dielectric fill material 35 and the upper surface of the hard mask 6 are coplanar.

Figure 6:
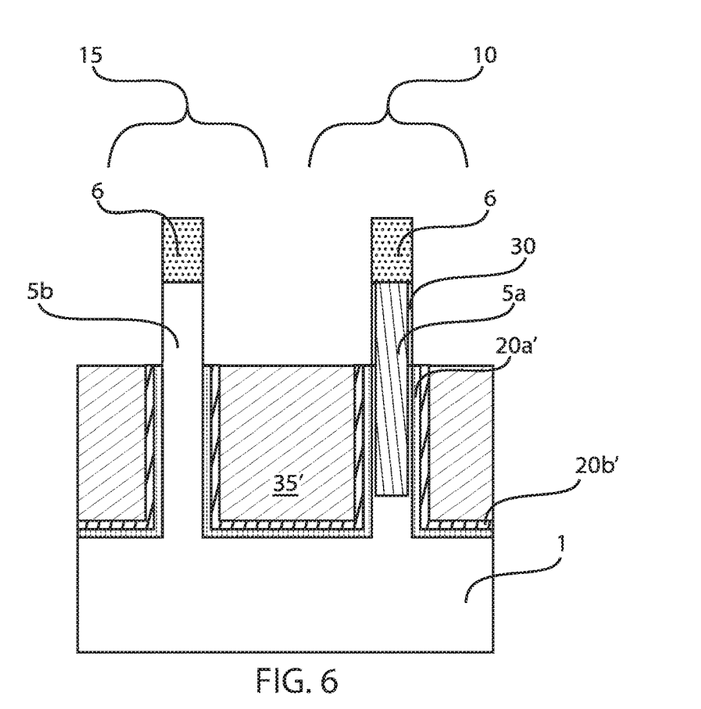
FIG. 6 is a side cross-sectional view depicting one embodiment of recessing the dielectric fill material to expose a reveal portion of the at least one silicon germanium containing fin structure and the at least one silicon containing fin structure; and etching an exposed portion of the fin liner.

FIG. 6 depicts one embodiment of recessing the dielectric fill material 35' to expose a reveal portion of the at least one silicon germanium containing fin structure 5a and the at least one silicon containing fin structure 5b; and etching an exposed portion of the fin liner 20a, 20b. The reveal portion of the at least one silicon germanium containing fin structure 5a and the silicon containing fin structure 5b is the portion of the fin structures 5a, 5b that the gate structure is formed on to provide the channel region of the device.

In some embodiments, the etch process for recessing the dielectric fill material 35' may be a dry etch or a wet etch. In some examples, the etch process may be an anisotropic etch, such as reactive ion etching (RIE). The etch process for recessing the dielectric fill material 35' may be a etch process that removes the dielectric fill material selectively to the fin liner 20a, 20b. As used herein, the term "selective" in reference to a material removal process denotes that the rate of material removal for a first material, e.g., dielectric fill material 35', is greater than the rate of removal for at least another material, e.g., fin liner 20a, 20b, of the structure to which the material removal process is being applied. For example, in one embodiment, a selective etch may include an etch chemistry that removes a first material selectively to a second material by a ratio of 10:1 or greater.

Still referring to FIG. 6, the method may continue with etching an exposed portion of the fin liner 20a', 20b' on the reveal portion of the at least one silicon germanium containing fin structure 5a and the at least one silicon containing fin structure 5b. The etch process for removing the exposed portion of the fin liner 20a', 20b' may be a dry etch or wet etch. In some embodiments, the etch process for removing the exposed portion of the fin liner 20a', 20b' may be an anisotropic etch process, such as reactive ion etching (RIE). In some embodiments, the etch process for removing the exposed portion of the fin liner 20a', 20b' may be selective to the silicon (Si) of the silicon containing fin structure 5b and the silicon germanium of the silicon and germanium containing fin structure 5a. The etch process for removing the exposed portion of the fin liner 20a', 20b' may also be selective to the dielectric fill material 35'.

Figure 7:
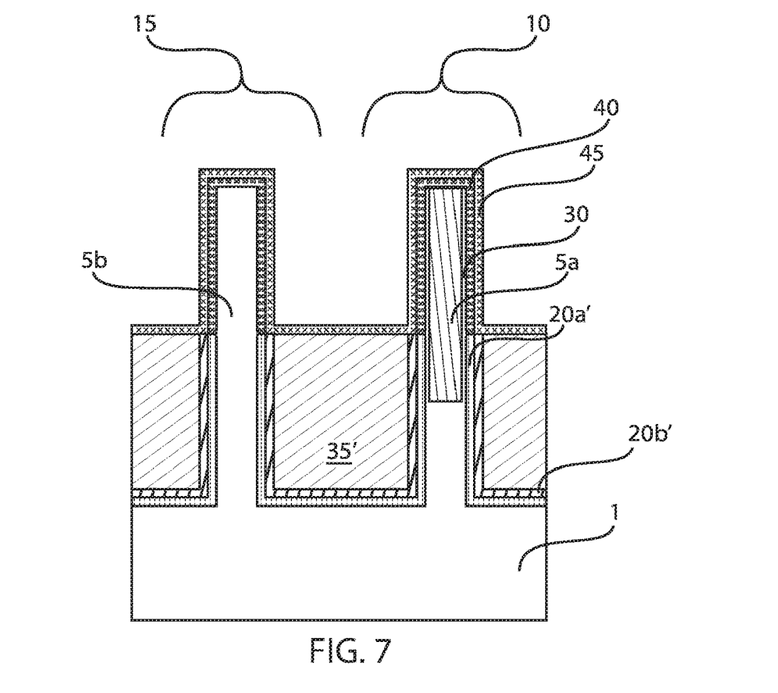
FIG. 7 is a side cross-sectional view depicting one embodiment of forming the gate dielectric of a gate structure on a channel region portion of the silicon and germanium containing fin structure and the silicon containing fin structure.

FIG. 7 depicts one embodiment of forming the gate dielectric 45 of a gate structure on a channel region portion of the silicon and germanium containing fin structure 5a and the silicon containing fin structure 5b. In some embodiments, prior to forming the gate dielectric 45, the hard mask 6 may be removed from each of the fin structures 5a, 5b. In some examples, the hard mask 6 can be removed using a selective etch process. In some embodiments, prior to forming the gate dielectric 45, an interfacial dielectric layer 40 is formed on the channel region of the silicon and germanium containing fin structure 5a and the silicon containing fin structure 5b. The interfacial dielectric layer 40 is typically an oxide, such as silicon oxide ($SiO_2$). The interfacial dielectric layer 40 may form by reaction with the silicon composition of the silicon containing fin structure 5b and the silicon composition of the silicon rich surface layer 30 of the silicon and germanium containing fin structure 5a. In some embodiments, the interfacial dielectric layer 40 may be formed using an oxidation process, such as thermal growth. In other embodiments, the interfacial dielectric layer 40 is a deposited material layer that can be formed using a chemical vapor deposition (CVD) process, such as plasma enhanced chemical vapor deposition (PECVD). The interfacial dielectric layer 40 is a thin layer having a thickness ranging from 1 nm to 5 nm.

Referring to FIG. 7, following the formation of the interfacial dielectric layer 40, a gate dielectric layer 45 may be deposited on the portion of the interfacial dielectric layer 40 that is present on the channel portions of the silicon and germanium containing fin structure 5a and the silicon containing fin structure 5b. In some embodiments, the gate dielectric layer 45 can be composed of a high-k dielectric material. High-k dielectric materials have a dielectric constant greater than silicon oxide ($SiO_2$). For example, high-k dielectrics having a dielectric constant greater than 4.0 at room temperature, e.g., 20° C. to 25° C. and atmospheric pressure, e.g., 1 atm. In one embodiment, the least one gate dielectric layer may be provided by a high-k dielectric material. In one embodiment, the least one gate dielectric layer is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric layer include hafnium silicate, hafnium silicon oxynitride or combinations thereof. In one embodiment, the at least one gate dielectric layer may be deposited by chemical vapor deposition (CVD). Variations of CVD processes suitable for depositing the at least one gate dielectric layer include, but are not limited to, atmospheric pressure chemical vapor deposition (APCVD), low pressure chemical vapor deposition (LPCVD), plasma enhanced chemical vapor deposition (PECVD), metal organic chemical vapor deposition (MOCVD), atomic layer deposition (ALD), and combinations thereof. In one embodiment, the thickness of the gate dielectric layer 45 is greater than 0.8 nm. More typically, the gate dielectric layer 45 has a thickness ranging from about 1.0 nm to about 6.0 nm.

Figure 8:
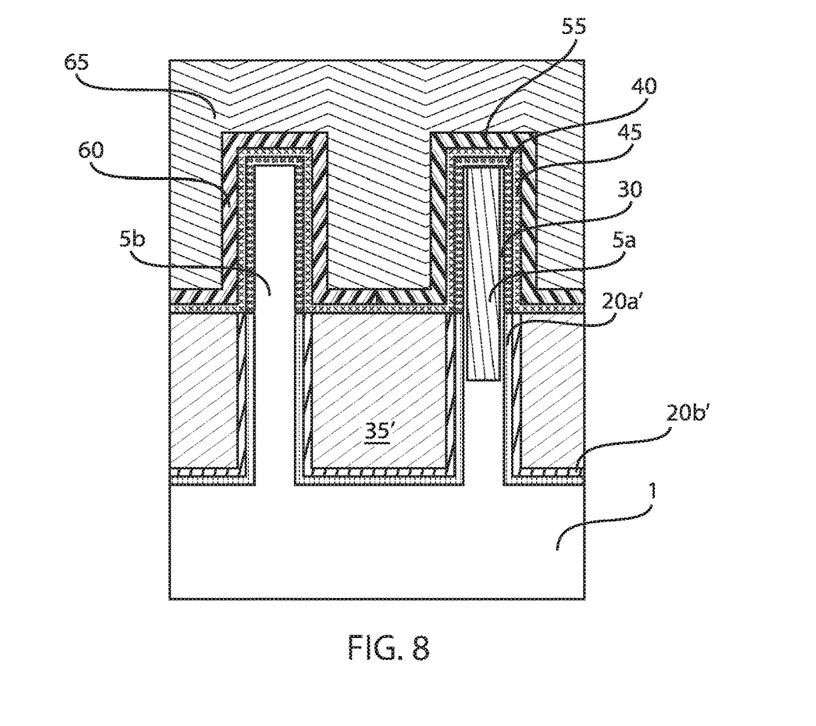
FIG. 8 is a side cross-sectional view depicting one embodiment of forming an n-type work function adjusting layer, a p-type work function adjusting layer and a gate electrode for providing gate structures to the silicon containing fin structure and the silicon germanium containing fin structure.

FIG. 8 depicts one embodiment of forming a p-type work function adjusting layer 55, an n-type work function adjusting layer 60 and a gate electrode 65 for providing gate structures to the silicon containing fin structure 5a, and the silicon germanium containing fin structure 5b.

The p-type work function adjusting layer 55 is typically formed over the at least one silicon and germanium containing fin structure 5a. As used herein, a "p-type work function metal layer" is a metal layer that effectuates a p-type threshold voltage shift. In one embodiment, the work function of the p-type work function metal layer 55 ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer 55 may be composed of titanium and their nitrided/carbide. In one embodiment, the p-type work function metal layer 55 is composed of titanium nitride (TiN). The p-type work function metal layer 55 may also be composed of TiAlN, Ru, Pt, Mo, Co and alloys and combinations thereof.

The n-type work function metal layer 60 may be formed over the silicon containing fin structure 5b. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer 60 ranges from 4.1 eV to 4.3 eV. In one embodiment, the n-type work function metal layer 60 is composed of at least one of TiAl, TaN, TiN, HfN, HfSi, or combinations thereof.

The gate electrode portion 65 of the gate structure may then be formed on the work function metal layers. In various embodiments, the gate electrode 65 is a metal, where the metal may be tungsten (W), tungsten nitride (WN) or combinations thereof. In one or more embodiments, the gate electrode 65 is tungsten (W). The gate electrode 65 may be deposited by CVD, e.g., plasma enhanced chemical vapor deposition (PECVD).

The material layers for the p-type work function layer 55, the n-type work function layer 60 and the gate electrode 65 may be deposited using physical vapor deposition, such as plating, electroplating, electroless deposition, sputtering and combinations thereof. The material layers for the gate dielectric 45, the p-type work function metal layer 55, the n-type work function metal layer and the gate conductor 65 may be patterned etched to provide the proper geometry of the gate structure. In some embodiments, gate sidewall spacers, such as spacers composed of a nitride, such as silicon nitride, is formed on the sidewalls of the gate structures.

Figure 9:
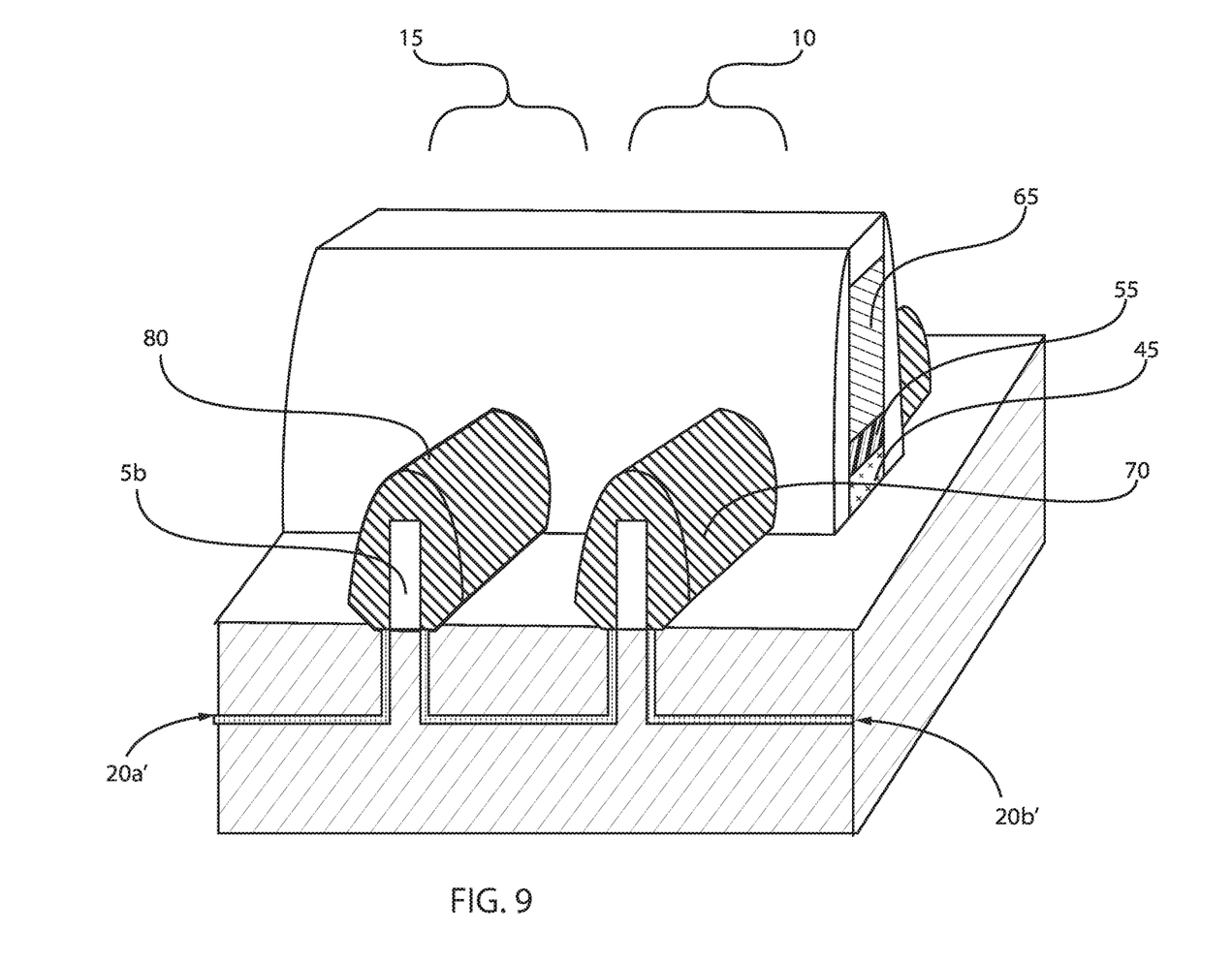
FIG. 9 is a side cross-sectional view depicting forming source and drain regions for the p-type semiconductor devices formed using the silicon and germanium containing fin structure, and forming source and drain regions for the n-type semiconductor devices formed using the silicon containing fin structure.

FIG. 9 depicting forming source and drain regions 70 for the p-type semiconductor devices formed using the silicon and germanium containing fin structure 5a, and forming source and drain regions 80 for the n-type semiconductor devices formed using the silicon containing fin structure 5b. The source and drain regions 70, 80 may be formed on the source and drain region portions of the fin structures 5a, 5b, which are present at opposing sides of the channel region portion of the fin structures 5a, 5b that the gate structure is present on. The source and drain regions 70, 80 may be formed using an epitaxial growth process, in which the n-type or p-type dopant is introduced by to the source and drain regions using in situ doping.

As used herein, "p-type" refers to the addition of impurities to an intrinsic semiconductor that creates deficiencies of valence electrons. As used herein, "n-type" refers to the addition of impurities that contributes free electrons to an intrinsic semiconductor. By "in-situ" it is meant that the dopant that dictates the conductivity type of the material layer for the source and drain regions 70, 80 is introduced during the process step, e.g., epitaxial deposition, that is forming the material layer. Alternatively, the dopant that provides the conductivity type of the source and drain regions 70, 80 is introduced by ion implantation. In some embodiments, the base material for the source and drain regions 70, 80 may be a type IV semiconductor, such as silicon or germanium. In a type IV semiconductor material, such as silicon and germanium, examples of p-type dopants, i.e., impurities, include but are not limited to: boron, aluminum, gallium and indium. In a type IV semiconductor material, such as silicon or germanium, examples of n-type dopants, i.e., impurities, include but are not limited to antimony, arsenic and phosphorous. Block mask may be used to independently process the fin structures 5a, 5b in forming the source and drain regions 70, 80.

The method that has been described with reference to FIGS. 1-9 can provide a semiconductor device, e.g., FinFET, that includes at least one silicon germanium containing fin structure 5a on a supporting substrate 1. The silicon germanium containing fin structure 5a may provide at least a channel portion of a p-type FinFET. The at least one germanium containing fin structure 5a may include having a surface layer 30 that is opposite a base of the fin structure 5a in contact with the supporting substrate 1. The surface layer being a silicon rich layer 30 that is present on a channel portion and source and drain region portions of said at least one silicon germanium containing fin structure 5a. The silicon rich layer 30 has greater than 95 at. % silicon. For example, the silicon rich layer 30 may be 99 at. % silicon or 100 at. % silicon. The silicon rich layer 30 has a thickness of less than 1 nm, e.g., the thickness of the silicon rich layer 30 may range from 1 monolayer of silicon atoms to 7 monolayers of silicon atoms.

A fin liner 20a', 20b' present along sidewalls of said at least one silicon germanium containing fin structure 5a that are positioned between the silicon rich layer 30 and the supporting substrate 1. A dielectric fill material 35' may be present adjacent to the base of the fin structure 5a, in which the upper surface of the dielectric fill material 35' is substantially coplanar with an upper surface of the fin liner 20a', 20b'.

A gate structure 45, 55, 65 is present on the channel portion of the at least one silicon germanium containing fin structure 5a. Source and drain regions 70 of epitaxial semiconductor material are present on the source and drain region portions of said at least one silicon germanium containing fin structure 5. The source and drain regions 70 are typically doped to a p-type conductivity, and in some examples may be composed of silicon germanium, silicon or a combination thereof.

In some embodiments, the p-type FinFET that includes the silicon and germanium containing, e.g., SiGe, fin structure 5a that is present in a first region 10 of the substrate 1, and an n-type FinFET that includes a silicon containing, e.g., Si, fin structure 5b that is present in a second region 15 of the substrate 1.

The silicon containing fin structure 5b can have the same geometry and dimensions as the silicon and germanium containing fin structure 5a. Similar to the p-type FinFET device including the silicon and germanium containing fin structure 5a, the n-type FinFET device including the silicon containing fin structure 5b also includes a fin structure having an upper portion that includes the channel region and source and drain region portions of the fin structure, and a base portion that is adjacent to a dielectric fill material 35'. The base portion of the silicon containing fin structure 5b is adjacent to a dielectric fill material 35'.

Similar to the p-type FinFET device including the silicon and germanium containing fin structure 5a, the n-type FinFET device including the silicon containing fin structure 5b also includes a fin liner 20a', 20b' present along sidewalls of the base portion of the fin structure, in which an upper surface of the fin structure 20a', 20b' has an upper surface that is coplanar with an upper surface of the dielectric fill material 35' that is adjacent to the base portion of the silicon containing fin structure 5b.

The n-type FinFET including the silicon containing fin structure 5b includes a gate structure 45, 60, 65 is present on the channel portion of the at least one silicon containing fin structure 5b. Source and drain regions 80 of epitaxial semiconductor material are present on the source and drain region portions of said at least one silicon containing fin structure 5b. The source and drain regions 80 are typically doped to an n-type conductivity, and in some examples can be composed of silicon.

The fin liner 25a', 25b' for each of the n-type FinFET and the p-type FinFET devices can include a layer of silicon germanium oxide (SiGeO$_x$) 25a' that is present on the silicon germanium containing fin structure 5a or the silicon containing fin structure 5b, and a silicon nitride containing layer 25b' present on the layer of silicon germanium oxide 25a. In some embodiments, the fin liner 25a', 25b' has a total thickness ranging from 1 nm to 10 nm.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a dual channel silicon/silicon germanium complementary metal oxide semiconductor performance with interface engineering (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device comprising:
   at least one silicon germanium containing fin structure on a supporting substrate having a surface layer on an upper portion of the fin structure that is opposite a base of the fin structure, the surface layer being a silicon rich layer that is present on a channel portion and source and drain region portions of said at least one silicon germanium containing fin structure;
   a fin liner present along sidewalls of a lower portion of said at least one silicon germanium containing fin structure, the fin liner present between the silicon rich layer and the supporting substrate;
   a gate structure present on the channel portion of the at least one silicon germanium containing fin structure; and
   source and drain regions of epitaxial semiconductor material on the source and drain region portions of said at least one silicon germanium containing fin structure.

2. The semiconductor device of claim 1, wherein the fin liner comprises a layer of silicon germanium oxide (SiGeOx) that is present on the at least one silicon germanium containing fin structure.

3. The semiconductor device of claim 2, wherein the fin liner further comprises a silicon nitride containing layer present on the layer of silicon germanium oxide.

4. The semiconductor device of claim 1, wherein the fin liner has a total thickness ranging from 1 nm to 10 nm.

5. The semiconductor device of claim 1, wherein the silicon rich layer comprises greater than 95 at. % silicon.

6. The semiconductor device of claim 5, wherein the silicon rich layer has a thickness ranging from 1 monolayer to seven monolayers of silicon atoms.

7. The semiconductor device of claim 6, wherein the at least one silicon germanium containing fin structure is silicon germanium (SiGe).

8. A semiconductor device comprising:
   at least one silicon germanium fin structure having an upper portion with a surface layer being a silicon rich layer that is present on a channel portion and source and drain region portions of said at least one silicon germanium containing fin structure;
   a fin liner present along sidewalls of a lower portion of said at least one silicon germanium fin structure that are positioned between the silicon rich layer and a supporting substrate;
   a gate structure present on the channel portion of the at least one silicon germanium fin structure; and
   source and drain regions on the source and drain region portions of said at least one silicon germanium fin structure.

9. The semiconductor device of claim 8, wherein the fin liner comprises a layer of silicon germanium oxide (SiGeOx).

10. The semiconductor device of claim 9, further comprising a silicon nitride layer present on the layer of silicon germanium oxide.

11. The semiconductor device of claim 8, wherein the fin liner has a total thickness ranging from 1 nm to 10 nm.

12. The semiconductor device of claim 8, wherein the silicon rich layer comprises greater than 95 at. % silicon.

13. The semiconductor device of claim 8, wherein the silicon rich layer has a thickness ranging from 1 monolayer to seven monolayers of silicon atoms.

14. A semiconductor device comprising:
- at least one silicon germanium fin structure having an upper portion with a surface layer being a silicon rich layer that is present on a channel portion and source and drain region portions of said at least one silicon germanium containing fin structure;
- a fin liner of comprises a layer of silicon germanium oxide (SiGeOx) present on a lower portion of the at least one silicon germanium fin structure along sidewalls of said at least one silicon germanium fin structure between the silicon rich layer and a supporting substrate; and
- a gate structure present on the channel portion of the at least one silicon germanium fin structure.

15. The semiconductor device of claim 14, wherein the fin liner further comprises a silicon nitride layer present on the layer of silicon germanium oxide.

16. The semiconductor device of claim 14, wherein the fin liner has a total thickness ranging from 1 nm to 10 nm.

17. The semiconductor device of claim 16, wherein the silicon rich layer comprises greater than 95 at. % silicon.

18. The semiconductor device of claim 14, wherein the silicon rich layer has a thickness ranging from 1 monolayer to seven monolayers of silicon atoms.

19. The semiconductor device of claim 18, wherein the gate structure comprises a p-type work function layer or an n-type work function layer.

20. The semiconductor device of claim 14, further comprising source and drain regions of epitaxial semiconductor material on opposing sides of the channel region.

* * * * *